United States Patent
Young et al.

(10) Patent No.: US 12,336,296 B2
(45) Date of Patent: Jun. 17, 2025

(54) SEMICONDUCTOR DEVICE INCLUDING SOURCE/DRAIN CONTACT HAVING HEIGHT BELOW GATE STACK

(71) Applicant: TAIWAN SEMICONDUCTOR MANUFACTURING CO., LTD., Hsinchu (TW)

(72) Inventors: Charles Chew-Yuen Young, Cupertino, CA (US); Chih-Liang Chen, Hsinchu (TW); Chih-Ming Lai, Hsinchu (TW); Jiann-Tyng Tzeng, Hsinchu (TW); Shun-Li Chen, Tainan (TW); Kam-Tou Sio, Hsinchu County (TW); Shih-Wei Peng, Hsinchu (TW); Chun-Kuang Chen, Hsinchu County (TW); Ru-Gun Liu, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/526,395

(22) Filed: Dec. 1, 2023

(65) Prior Publication Data
US 2024/0096867 A1  Mar. 21, 2024

Related U.S. Application Data

(60) Continuation of application No. 18/167,651, filed on Feb. 10, 2023, now Pat. No. 11,862,623, which is a
(Continued)

(51) Int. Cl.
*H10D 89/10* (2025.01)
*G06F 30/394* (2020.01)
(Continued)

(52) U.S. Cl.
CPC .......... *H10D 89/10* (2025.01); *G06F 30/394* (2020.01); *H01L 21/76895* (2013.01);
(Continued)

(58) Field of Classification Search
CPC ......... H01L 21/76819; H01L 21/76879; H01L 21/76895; H01L 21/76897;
(Continued)

(56) References Cited

U.S. PATENT DOCUMENTS 7,667,271 B2   2/2010  Yu et al.
7,910,453 B2   3/2011  Xu et al.
(Continued)

FOREIGN PATENT DOCUMENTS

CN   101677102 A   3/2010
CN   103199063 A   7/2013
(Continued)

OTHER PUBLICATIONS

Quirk et al., "Semiconductor Manufacturing Technology", Prentice Hall, Upper Saddle, Rive, NJ, Sep. 2001.

*Primary Examiner* — Matthew E. Gordon
(74) *Attorney, Agent, or Firm* — Maschoff Brennan

(57) ABSTRACT

A semiconductor structure is provided and includes a first gate structure, a second gate structure, and at least one local interconnect that extend continuously across a non-active region from a first active region to a second active region. The semiconductor structure further includes a first separation spacer disposed on the first gate structure and first vias on the first gate structure. The first vias are arranged on opposite sides of the first separation spacer are isolated from each other and apart from the first separation spacer by different distances.

20 Claims, 13 Drawing Sheets

Related U.S. Application Data division of application No. 17/092,100, filed on Nov. 6, 2020, now Pat. No. 11,581,300, which is a continuation of application No. 16/216,843, filed on Dec. 11, 2018, now Pat. No. 10,833,061, which is a continuation of application No. 15/159,692, filed on May 19, 2016, now Pat. No. 10,177,133, which is a continuation-in-part of application No. 14/280,196, filed on May 16, 2014, now Pat. No. 9,478,636.

(51) Int. Cl.
| | | |
|---|---|---|
| *H01L 21/768* | (2006.01) | |
| *H01L 23/485* | (2006.01) | |
| *H01L 23/528* | (2006.01) | |
| *H10D 30/01* | (2025.01) | |
| *H10D 64/01* | (2025.01) | |
| *H10D 84/01* | (2025.01) | |
| *H10D 84/03* | (2025.01) | |
| *H10D 86/01* | (2025.01) | |

(52) U.S. Cl.
CPC ......... *H01L 23/485* (2013.01); *H10D 84/013* (2025.01); *H10D 84/0133* (2025.01); *H10D 84/0135* (2025.01); *H10D 84/0149* (2025.01); *H10D 84/0158* (2025.01); *H10D 84/038* (2025.01); *H01L 21/76897* (2013.01); *H01L 23/528* (2013.01); *H01L 2924/0002* (2013.01); *H10D 30/0227* (2025.01); *H10D 64/021* (2025.01); *H10D 86/011* (2025.01)

(58) Field of Classification Search
CPC ..... H01L 21/823418; H01L 21/823431; H01L 21/823437; H01L 21/823475; H01L 23/485; H01L 23/528; H01L 23/535; H01L 27/0207; H10D 89/10; H10D 84/013; H10D 84/0133; H10D 84/0135; H10D 84/0149
USPC ............................................. 257/369; 438/14
See application file for complete search history.

(56) References Cited

U.S. PATENT DOCUMENTS

| | | | |
|---|---|---|---|
| 8,315,084 B2* | 11/2012 | Liaw | G11C 11/412 365/189.11 |
| 8,377,779 B1 | 2/2013 | Wang | |
| 8,399,931 B2 | 3/2013 | Liaw et al. | |
| 8,586,436 B2 | 11/2013 | Ng et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,041,087 B2 | 5/2015 | Yuan et al. | |
| 9,105,490 B2 | 8/2015 | Wang et al. | |
| 9,418,728 B2 | 8/2016 | Liaw | |
| 9,478,636 B2* | 10/2016 | Chen | H01L 23/5283 |
| 9,917,050 B2* | 3/2018 | Chen | H01L 29/42364 |
| 10,177,133 B2* | 1/2019 | Young | H01L 21/823437 |
| 10,833,061 B2* | 11/2020 | Young | G06F 30/394 |
| 11,581,300 B2* | 2/2023 | Young | G06F 30/394 |
| 11,862,623 B2* | 1/2024 | Young | H01L 21/823425 |
| 2005/0277258 A1 | 12/2005 | Huang et al. | |
| 2007/0099414 A1 | 5/2007 | Frohberg et al. | |
| 2008/0099921 A1 | 5/2008 | Katata | |
| 2008/0116583 A1 | 5/2008 | Yuki | |
| 2009/0026503 A1* | 1/2009 | Tsuda | H01L 27/0207 257/E27.07 |
| 2010/0052062 A1 | 3/2010 | Fukui et al. | |
| 2010/0117120 A1* | 5/2010 | Yamashita | H01L 27/092 257/369 |
| 2011/0241126 A1* | 10/2011 | Herberholz | H01L 23/4824 257/E21.409 |
| 2012/0181623 A1 | 7/2012 | Luo et al. | |
| 2012/0211836 A1 | 8/2012 | Takeuchi | |
| 2013/0175583 A1 | 7/2013 | Yuan et al. | |
| 2014/0001574 A1 | 1/2014 | Chen et al. | |
| 2014/0054722 A1 | 2/2014 | Kawa et al. | |
| 2014/0110755 A1 | 4/2014 | Colinge | |
| 2014/0151812 A1 | 6/2014 | Liaw | |
| 2014/0252477 A1 | 9/2014 | Tseng et al. | |
| 2016/0049395 A1 | 2/2016 | Okagaki et al. | |
| 2016/0181255 A1* | 6/2016 | Nii | G11C 8/16 257/369 |

FOREIGN PATENT DOCUMENTS

| | | |
|---|---|---|
| CN | 105097470 A | 11/2015 |
| DE | 10 2014 110 957 A1 | 1/2016 |
| JP | 2001110769 A | 4/2001 |
| KR | 10-2016-0021726 A | 2/2016 |
| TW | I354218 B | 12/2011 |
| TW | I443541 B | 7/2014 |
| TW | I488288 B | 6/2015 |
| WO | 2015019411 A1 | 2/2015 |

\* cited by examiner

SEMICONDUCTOR DEVICE INCLUDING SOURCE/DRAIN CONTACT HAVING HEIGHT BELOW GATE STACK

RELATED APPLICATIONS

This application is a continuation of U.S. application Ser. No. 18/167,651, filed Feb. 10, 2023, which is divisional application of U.S. application Ser. No. 17/092,100, filed Nov. 6, 2020, now U.S. Pat. No. 11,581,300, issued Feb. 14, 2023, which is a continuation of U.S. application Ser. No. 16/216,843, filed Dec. 11, 2018, Now U.S. Pat. No. 10,833,061, issued Nov. 10, 2020, which is a continuation of U.S. application Ser. No. 15/159,692, filed May 19, 2016, Now U.S. Pat. No. 10,177,133, issued Jan. 8, 2019, which is a continuation-in-part application which claims the priority benefit of U.S. application Ser. No. 14/280,196, filed May 16, 2014, now U.S. Pat. No. 9,478,636, issued Oct. 25, 2016, all of which are herein incorporated by reference.

BACKGROUND

The semiconductor integrated circuit (IC) industry has experienced exponential growth. In IC evolution, the number of interconnected devices per chip area has generally increased while the smallest component that can be created using a fabrication process has decreased. Such scaling down process increases the complexity of processing and manufacturing ICs.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
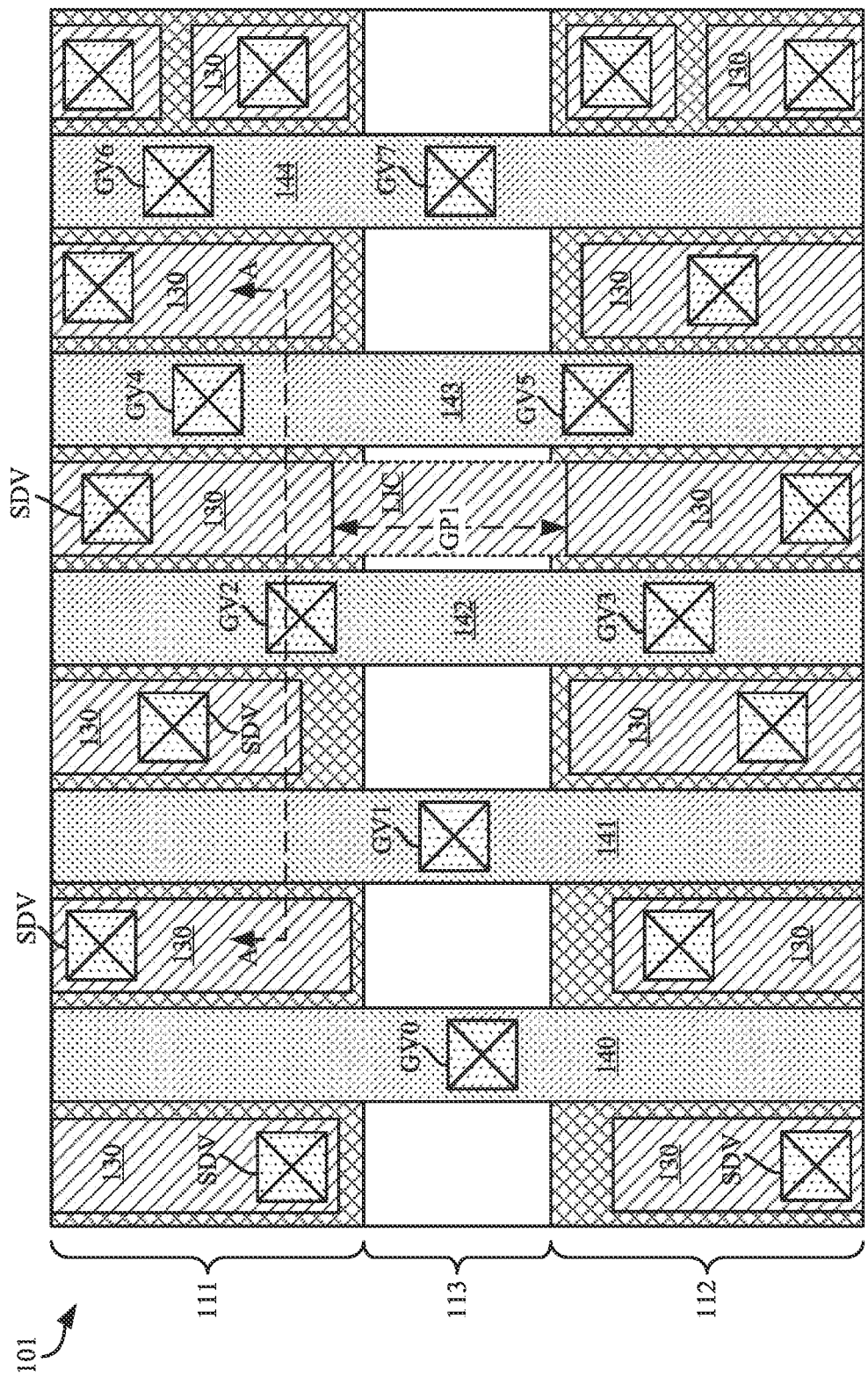
FIG. 1A is a top view of a schematic layout of a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms including, for example, "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Field effect transistors (FETs) typically include active regions and gate structures over the active regions. Conductive features including, for example, contacts and vias, are formed on the FETs for providing electrical connection from a terminal (e.g., source/drain/gate) of an FET to, for example, terminal(s) of another FET. As semiconductor process technology continues to scale down, process variations have become more and more challenging in the manufacturing of integrated circuits (ICs). U.S. application Ser. No. 14/280,196, filed May 16, 2014, provides some embodiments about implementing gate vias in active regions of a semiconductor device.

FIG. 1A is a top view of a schematic layout of a semiconductor structure 101 according to some embodiments of the present disclosure. The semiconductor structure 101 discussed in the present disclosure is given for illustrative purposes.

In some embodiments, at least a portion of the semiconductor structure 101 illustrated in FIG. 1A, and semiconductor structures as will be discussed with reference to FIG. 2A and FIGS. 4A-6, represents a standard cell. The standard cell, in some embodiments, refers to a pre-designed cell that has been laid out and stored in a circuit library that is in a form of a database. Moreover, the standard cell, in some embodiments, is stored in a tangible storage medium, including, for example, a hard drive. In the design of integrated circuits, the standard cell is retrieved from the circuit library, and is placed in a placement operation. The placement operation is performed, for example, using a computer, which runs the software for designing integrated circuits. The software includes a circuit layout tool, which has a function of placement and routing.

In some embodiments, the semiconductor structure 101, and the semiconductor structures as will be discussed with reference to FIG. 2A and FIGS. 4A-6, are implemented in a semiconductor device. In some other embodiments, the semiconductor structure 101 as shown in FIG. 1A, and the semiconductor structures as will be discussed with reference to FIG. 2A and FIGS. 4A-6, are each an intermediate device fabricated during processing of an integrated circuit (IC) or a portion thereof. In some embodiments, the IC or the portion thereof includes static random access memory (SRAM) and/or other logic circuits, passive components including, for example, resistors, capacitors, and inductors, active components including, for example, p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and/or combinations thereof.

As illustrated in FIG. 1A, the semiconductor structure 101 includes a first active region 111 and a second active region 112 that are formed on a substrate (not shown). The first active region 111 and the second active region 112 are spaced apart by a non-active region 113. In some embodiments, the substrate is a silicon substrate. In some other embodiments, the substrate includes another elementary semiconductor including, for example, germanium; a compound semiconductor including, for example, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or the combinations thereof. In yet other embodiments, the substrate is a semiconductor on insulator (SOI). The types of the substrate discussed above are given for illustrative purposes. Various types of the substrate are within the contemplated scope of the present disclosure.

In some embodiments, the first active region 111 and the second active region 112 are of the same type, for example, n-type or p-type. In some other embodiments, the first active region 111 and the second active region 112 are of different types, for example, one being n-type and the other being p-type.

For illustration in FIG. 1A, the semiconductor structure 101 further includes gate structures 140-144 and gate vias GV0-GV7. For simplicity of illustration, only the gate structures 140-144 and the gate vias GV0-GV7 are shown in FIG. 1A. Various numbers of the gate structures and the gate vias are within the contemplated scope of the present disclosure.

The gate structures 140-144 are arranged on the first active region 111, the second active region 112 and the non-active region 113 correspondingly, as shown in FIG. 1A. For illustration, the gate structures 140-144 are arranged in parallel and extended longitudinally over the first active region 111, the non-active region 113, and the second active region 112.

The gate vias GV0-GV7 are arranged on the gate structures 140-144 correspondingly, as shown in FIG. 1A. In some embodiments, the gate vias GV0-GV7 are electrically coupled with the gate structures 140-144 correspondingly.

In some embodiments, at least one of the gate vias GV0-GV7 is disposed above the first active region 111, the second active region 112, and/or the non-active region 113. For illustration in FIG. 1A, the gate vias GV0, GV1 and GV7 are disposed above the non-active region 113; the gate vias GV2, GV4 and GV6 are disposed above the first active region 111; and the gate vias GV3 and GV5 are disposed above the second active region 112.

In some embodiments, the gate structures 140-144 are formed of metal. In some other embodiments, the gate structures 140-144 are formed of non-metal conductive material including, for example, conductive polymeric material or grapheme material.

In some embodiments, each one of the gate structures 140, 141, 142, 143 and 144 includes an interfacial layer (not shown) and a polysilicon (or poly) layer (not shown) over the interfacial layer. In some embodiments, the gate structures 140, 141, 142, 143 and 144 further include a gate dielectric layer (not shown) and a metal gate layer (not shown) disposed between the interfacial layer and the poly layer. In some embodiments, the gate structures 140, 141, 142, 143 and 144 includes one or more metal layers in place of the poly layer. In various embodiments, the interfacial layer includes a dielectric material including, for example, silicon oxide ($SiO_2$) or silicon oxynitride (SiON), and is able to be formed by chemical oxidation, thermal oxidation, atomic layer deposition (ALD), chemical vapor deposition (CVD), and/or other suitable methods. In some embodiments, the polysilicon layer is formed by suitable deposition processes including, for example, low-pressure chemical vapor deposition (LPCVD) and plasma-enhanced CVD (PECVD). In some embodiments, the gate dielectric layer uses a high-k dielectric material including, for example, hafnium oxide ($HfO_2$), $Al_2O_3$, lanthanide oxides, $TiO_2$, $HfZrO$, $Ta_2O_3$, $HfSiO_4$, $ZrO_2$, $ZrSiO_2$, combinations thereof, or other suitable material, and the gate dielectric layer is formed by ALD and/or other suitable methods. The metal gate layer includes a p-type work function metal or an n-type work function metal, and is deposited by CVD, PVD, and/or other suitable process. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The one or more metal layers use aluminum (Al), tungsten (W), copper (Cu), cobalt (Co), and/or other suitable materials; and are formed by CVD, PVD, plating, and/or other suitable processes. The formations and/or materials associated with the gate structures 140-144 are given for illustrative purposes. Various formations and/or materials associated with the gate structures 140-144 are within the contemplated scope of the present disclosure.

As illustrated in FIG. 1A, source/drain contacts 130 are disposed over the first active region 111 and the second active region 112 correspondingly. In some embodiments, the source/drain contacts 130 are spaced apart from the gate structures 140-144, for illustration, by spacers 152 and spacer 134 shown in FIG. 1B. For illustration in FIG. 1A, between adjacent two of the gate structures 140-144, one source/drain contact 130 over the first active region 111 and one source/drain contact 130 over the second active region 112 are arranged.

In some embodiments, the semiconductor structure 101 further includes source/drain vias SDV. The source/drain vias SDV are electrically coupled with the source/drain contacts 130. The source/drain vias SDV are arranged above the first active region 111 and the second active region 112 correspondingly, as shown in FIG. 1A. In some embodiments, the gate vias GV0-GV7 and the source/drain vias SDV are coupled to vias (not shown) in another portion of the semiconductor structure 101. In some other embodiments, the gate vias GV0-GV7 and the source/drain vias SDV are coupled through conductive features (not shown) in another layer of the semiconductor structure 101, including, for example, metal interconnects, in order to form a semiconductor device.

For simplicity of illustration, only a few of designations "SDV" are labeled in FIG. 1A, and the like elements shown in FIG. 1A are also referred to as the source/drain vias SDV. Moreover, the term "source/drain" discussed above refers to a region that may be a source region or a drain region.

Figure 1B:
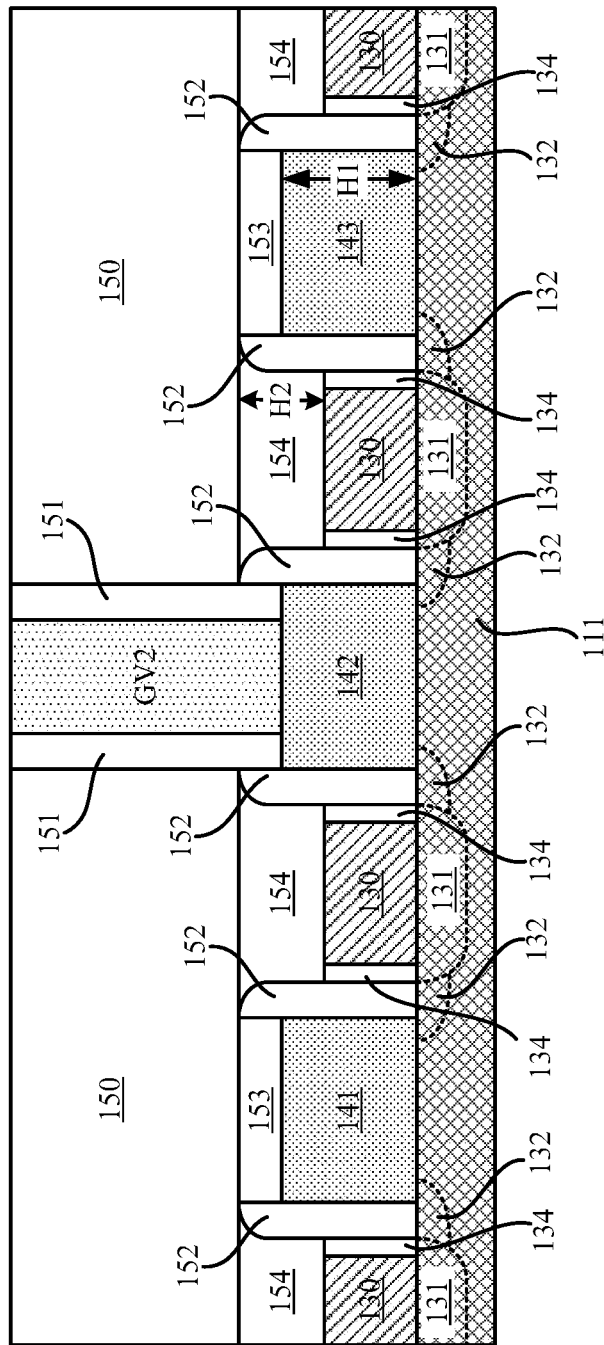
FIG. 1B is a cross sectional view of the semiconductor structure in FIG. 1A, according to some embodiments of the present disclosure.

FIG. 1B is a cross sectional view, along the "A-A" line, of the semiconductor structure 101 in FIG. 1A, according to some embodiments of the present disclosure. With respect to the embodiments of FIG. 1A, like elements in FIG. 1B are designated with the same reference numbers for ease of understanding.

With reference to FIG. 1A and FIG. 1B, in some embodiments, spacers 152 are formed around the gate structures 140-144. For illustration in FIG. 1B, the spacers 152 are formed around the gate structures 141-143, and the spacers 134 are formed around the source/drain contacts 130. The spacers 152 and the spacers 134 are disposed between the gate structures 141-143 and the corresponding source/drain contacts 130. In some embodiments, the spacers 152 include dielectric materials including, for example, silicon oxide, silicon nitride, silicon oxynitride, other dielectric material, and/or combinations thereof.

In some embodiments, gate opens 153 are disposed, for illustration in FIG. 1B, above the gate structures 141 and 143. In some embodiments, the gate opens 153 are intermediate products in order to form openings on the gate structures 141-143. After the gate open 153 are removed, the gate structures 141-143 are able to be exposed. For illustration in FIG. 1B, a gate open above the gate structure 142, which is not shown in FIG. 1B, is etched and removed, in order to receive the gate via GV2. In some embodiments, the gate opens 153 are formed of metal including, for example, aluminum (Al), tungsten (W), copper (Cu), cobalt (Co), combinations thereof, or other suitable material. In some embodiments, the gate opens 153 are also referred to as "self-aligned contacts (SAC)" and are formed by a self-aligned formation process.

The layout of the semiconductor structure 101 shown in FIG. 1A illustrates distributions of gates, sources and drains of transistors. Each of the transistors is formed with two source/drain contacts 130 and one corresponding gate structure, of the gate structure 140-144, between the two source/drain contacts 130.

As illustrated in FIG. 1B, there are source/drain regions 131 formed, for illustration, in corresponding portions of the first active region 111 in FIG. 1B. The source/drain contacts 130 are disposed above the source/drain regions 131. Correspondingly, there are also source/drain regions 131 formed in the second active region 112, and for simplicity of illustration, they are not illustrated in figures. In some embodiments, as illustrated in FIG. 1B, there are lightly doped diffusion (LDD) regions 132 formed, for illustration, around the source/drain regions 131 and in corresponding portions of the first active region 111 in FIG. 1B.

Referring to FIG. 1B, the semiconductor structure 101 further includes a contact protection layer 154 over the source/drain contacts 130 in some embodiments. The contact protection layer 154 is formed to protect the source/drain contacts 130 from being accidentally coupled to, for illustration, the gate via GV2 labeled in FIG. 1B, during manufacturing processes. In some embodiments, the contact protection layer 154 includes a dielectric material. In various embodiments, the contact protection layer 154 is formed of titanium oxide ($TiO_2$), silicon oxide ($SiO_2$), silicon oxynitride (SiON), silicon nitride ($SiN_3$), combinations thereof, or other suitable material.

In some embodiments, a thickness of the contact protection layer 154 is different from a height of at least one of the gate structures 140-144. For illustration in FIG. 1B, the contact protection layer 154 is formed to have a thickness "H2," and each one of the gate structures 140-144 has a height "H1." In some embodiments, the thickness H2 is at least 0.2 times the height H1, in order to ensure the electrically dielectric function. In some other embodiments, the thickness H2 is no more than 1.7 times the height H1, in order to prevent from occupying too much space, and/or to prevent from an increasing delay time resulted from a high capacitance induced by the thickness H2. In alternative embodiments, the thickness H2 of the contact protection layer 154 is about 0.2 to about 1.7 times the height H1 of the gate structures 140-144. In further embodiments, the thickness H2 is about 0.2 to about 1.5 times the height H1.

For illustration in FIG. 1B, the semiconductor structure 101 further includes an inter-layer dielectric (ILD) layer 150 in some embodiments. The gate via GV2 is formed in an opening through the ILD layer 150. In such configurations, the gate via GV2 provides connectivity between the gate structure 142 and other terminals of the semiconductor structure 101. In some embodiments, the ILD layer 150 includes dielectric materials, including, for example, silicon oxide ($SiO_2$), silicon oxynitride (SiON), silicon nitride ($SiN_3$), and/or other suitable dielectric materials.

In some embodiments, the semiconductor structure 101 further includes a barrier layer 151. For illustration in FIG. 1B, the barrier layer 151 is formed on sidewalls of the opening in which the gate via GV2 is disposed, as discussed above. The barrier layer 151 is formed between the gate via GV2 and the ILD layer 150, for preventing the material of the gate via GV2 from diffusing into the ILD layer 150.

In some embodiments, a local interconnect LIC is arranged over the non-active region 113, between adjacent two of the gate structures 140-144. For illustration in FIG. 1A, the local interconnect LIC is arranged between the gate structures 142 and 143. The local interconnect LIC is electrically coupled with two opposite corresponding source/drain contacts 130 that are separately disposed over the first active region 111 and the second active region 112, as illustrated in FIG. 1A.

In some embodiments, the local interconnect LIC is formed by extending the corresponding source/drain contacts 130 as discussed above, in a longitudinal direction. For illustration in FIG. 1A, the corresponding source/drain contact 130 disposed over the first active region 111 is extended in a longitudinal direction toward the second active region 112, to form the local interconnect LIC over the non-active region 113. Alternatively, the corresponding source/drain contact 130 disposed over the second active region 112 is extended in a longitudinal direction toward the first active region 111, to form the local interconnect LIC over the non-active region 113. Alternatively stated, the source/drain contacts 130 disposed over the corresponding first active region 111 and the corresponding second active region 112 are coupled to each other.

In some embodiments, the local interconnect LIC is formed at a gap GP1 in FIG. 1A to interconnect the source/drain contacts 130 over the corresponding first active region 111 and the corresponding second active region 112. For illustration in FIG. 1A, the gap GP1 is located between the gate structures 142 and 143 above the non-active region 113. There is no gate via disposed on gate structures 142 and 143 above the non-active region 113, such that the local interconnect LIC disposed at the gap GP1 is not adjacent to any gate via on neighboring gate structures 142 and 143.

Figure 2A:
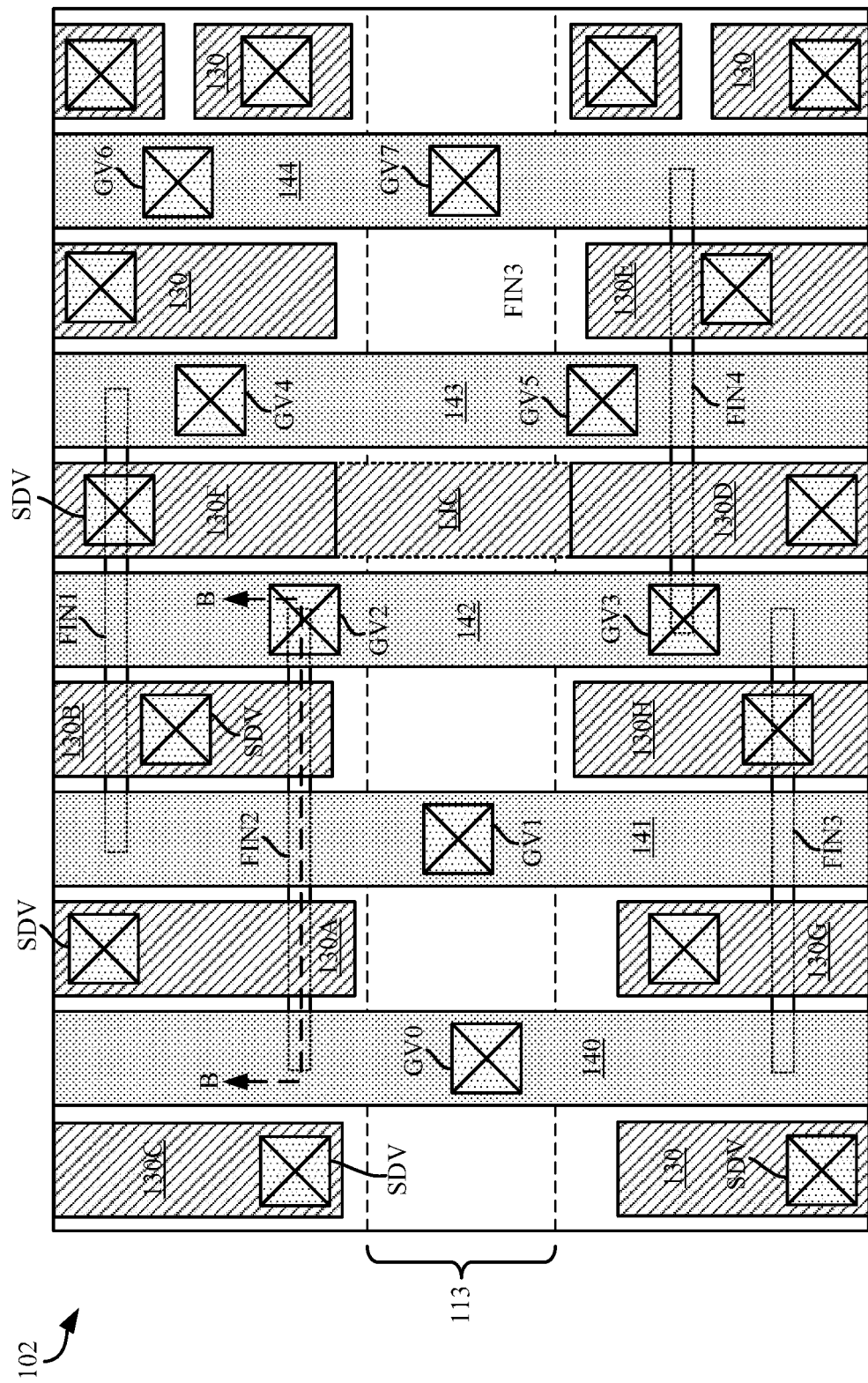
FIG. 2A is a top view of a schematic layout of a semiconductor structure according to some other embodiments of the present disclosure.
Figure 2B:
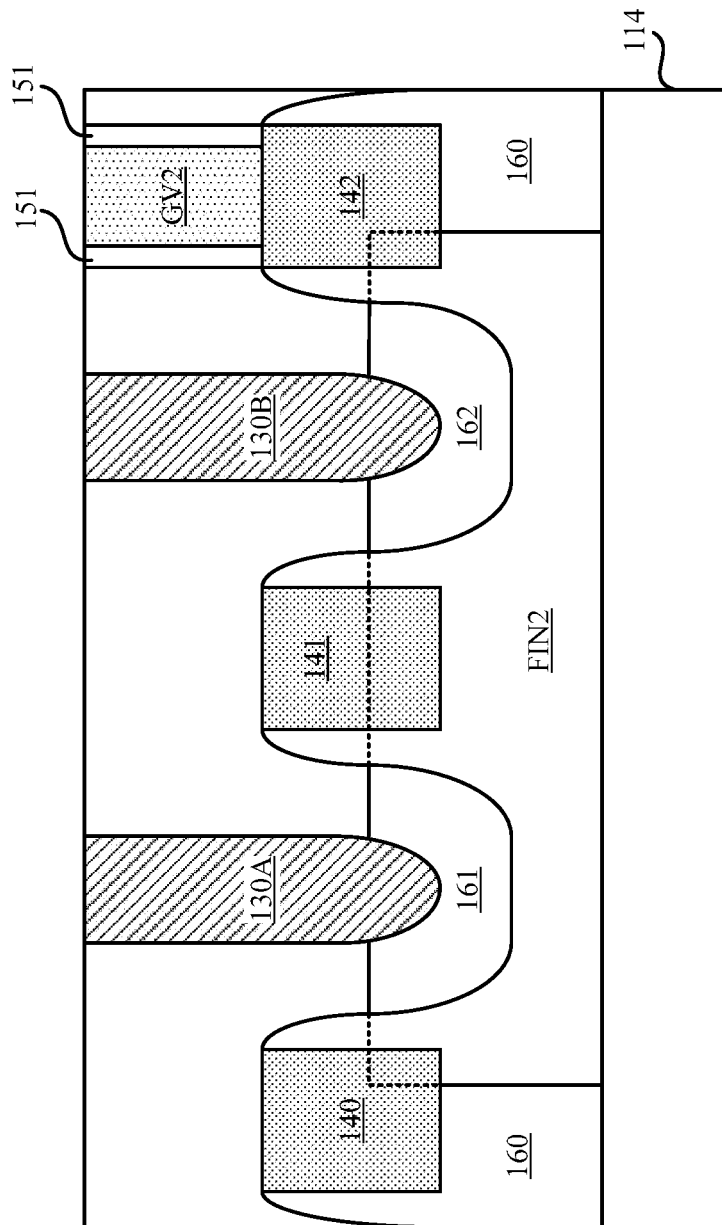
FIG. 2B is a cross sectional view of the semiconductor structure in FIG. 2A, according to some embodiments of the present disclosure.

FIG. 2A is a top view of a schematic layout of a semiconductor structure 102 according to some other embodiments of the present disclosure. FIG. 2B is a cross sectional view, along the "B-B" line, of the semiconductor structure 102 in FIG. 2A, according to some embodiments of the present disclosure. With respect to the embodiments of FIG. 1A and FIG. 1B, like elements in FIG. 2A and FIG. 2B are designated with the same reference numbers for ease of understanding. The semiconductor structure 102 discussed in the present disclosure is given for illustrative purposes.

Compared to the semiconductor structure 101 in FIG. 1A, in some embodiments, the semiconductor structure 102 in FIG. 2A further includes fin structures including, for illustration, fin structures FIN1, FIN2, FIN3 and FIN4, without the first active region 111 and the second active region 112. In FIG. 2A, for simplicity of illustration, the fin structures FIN1, FIN2, FIN3 and FIN4 are shown in FIG. 2A, and various numbers of fin structures implemented in the semiconductor structure 102 are within the contemplated scope of the present disclosure.

In some embodiments, at least one of the fin structures FIN1, FIN2, FIN3 and FIN4 is formed of materials including, for example, silicon, silicon-germanium, and the like. Various materials to form the fin structures FIN1, FIN2, FIN3 and FIN4 are within the contemplated scope of the present disclosure.

For illustration in FIG. 2A and FIG. 2B, the fin structure FIN2 under the gate structure 141 is extended from where the gate structure 140 is disposed to where the gate structure 142 is disposed. The gate structure 141 and the source/drain contacts 130A and 130B are arranged to implement a Fin Field Effect Transistor (FinFET) with the fin structure FIN2.

For corresponding illustration in FIG. 2B, the fin structure FIN2 is disposed on a substrate 114. A Shallow Trench Isolation (STI) layer 160 is also disposed on the substrate 114 and located around the fin structure FIN2. An epitaxial source/drain layer 161 is disposed between the source/drain contact 130A and the fin structure FIN2. Another epitaxial source/drain layer 162 is disposed between the source/drain contact 130B and the fin structure FIN2.

In some embodiments, the region for accommodating the fin structure FIN2 is regarded as an active region. Correspondingly, regions for accommodating the fin structures FIN1, FIN3 and FIN4 are regarded as active regions. For corresponding illustration in FIG. 2A, a non-active region 113 is located at an area where none of the fin structures FIN1-FIN4 is disposed. In some embodiments, the source/drain contacts 130, 130A-130H are not extended over the non-active region 113, as illustrated in FIG. 2A.

For corresponding illustration in FIG. 2A, the fin structure FIN1 under the gate structure 142 is extended from where the gate structure 141 is disposed to where the gate structure 143 is disposed. The gate structure 142 and the source/drain contacts 130B and 130F are arranged to implement a Fin Field Effect Transistor (FinFET) with the fin structure FIN1. The fin structure FIN3 in FIG. 2A under the gate structure 141 is extended from where the gate structure 140 is disposed to where the gate structure 142 is disposed. The gate structure 141 and the source/drain contacts 130G and 130H are arranged to implement another FinFET with the fin structure FIN3. The fin structure FIN4 in FIG. 2A under the gate structure 143 is extended from where the gate structure 142 is disposed to where the gate structure 144 is disposed. The gate structure 143 and the source/drain contacts 130D and 130E are arranged to implement another FinFET with the fin structure FIN4.

In some embodiments, a local interconnect LIC is arranged over the non-active region 113 in FIG. 2A. For illustration in FIG. 2A, the local interconnect LIC is arranged between the gate structures 142 and 143, to connect the source/drain contact 130F and the source/drain contact 130D, which are located on opposite sides of the non-active region 113.

The devices, in which the semiconductor structures discussed in the present disclosure are implemented, are given for illustrative purposes. Various devices, in which the semiconductor structures discussed in the present disclosure are implemented, are within the contemplated scope of the present disclosure. For example, the semiconductor structures discussed in the present disclosure are able to be implemented in planar FETs, three-dimensional devices, multi-gate devices including, for example, double gate FETs, FinFETs, tri-gate FETs, omega FETs, Gate-All-Around (GAA) devices, and vertical GAA devices, and the like.

In various embodiments, some guidelines are provided in following paragraphs of the present disclosure for demonstrating when and/or where to arrange or form the local interconnect LIC in the semiconductor structure 101 in FIG. 1A and/or the semiconductor structure 102 in FIG. 2A.

Figure 3:
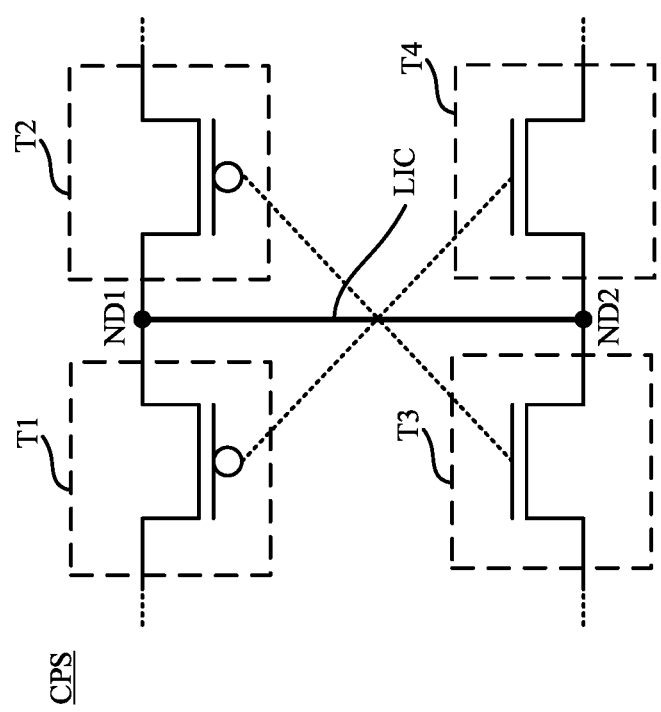
FIG. 3 is a schematic diagram illustrating a cross-coupling structure of four transistors.

FIG. 3 is a schematic diagram illustrating a cross-coupling structure CPS of four transistors T1, T2, T3 and T4. In some embodiments, the cross-coupling structure CPS shown in FIG. 3 is utilized in some electronic circuits including, for example, a multiplexer, a memory, a decoder or any equivalent logic unit. As shown in FIG. 3, the source/drain contacts of the transistors T1 and T2 are coupled to a node ND1, and the source/drain contacts of the transistors T3 and T4 are coupled to a node ND2. The two nodes ND1 and ND2 are coupled to each other, for illustration, by the local interconnect LIC as discussed above.

To implement the cross-coupling structure CPS discussed above, whether to arrange the local interconnect LIC, for illustration in FIG. 1A and FIG. 2A, is determined. In some embodiments, a first guideline is provided to determine whether to arrange the local interconnect LIC. When the first guideline is followed, the local interconnect LIC, for illustration in FIG. 1A, is able to be arranged, in order to realize the cross-coupling structure CPS in FIG. 3. The first guideline is discussed below with reference to embodiments of FIGS. 4A-4E.

FIGS. 4A-4E are each a top view of a schematic layout of a semiconductor structure corresponding to a portion of the semiconductor structure 101 in FIG. 1A, in accordance with various embodiments of the present disclosure. With respect to the embodiments of FIG. 1A and FIG. 3, like elements in FIGS. 4A-4E are designated with the same reference numbers for ease of understanding. FIGS. 4A-4E illustrate the embodiments in which at least one local interconnect is arranged when the first guideline is followed.

Figure 4A:
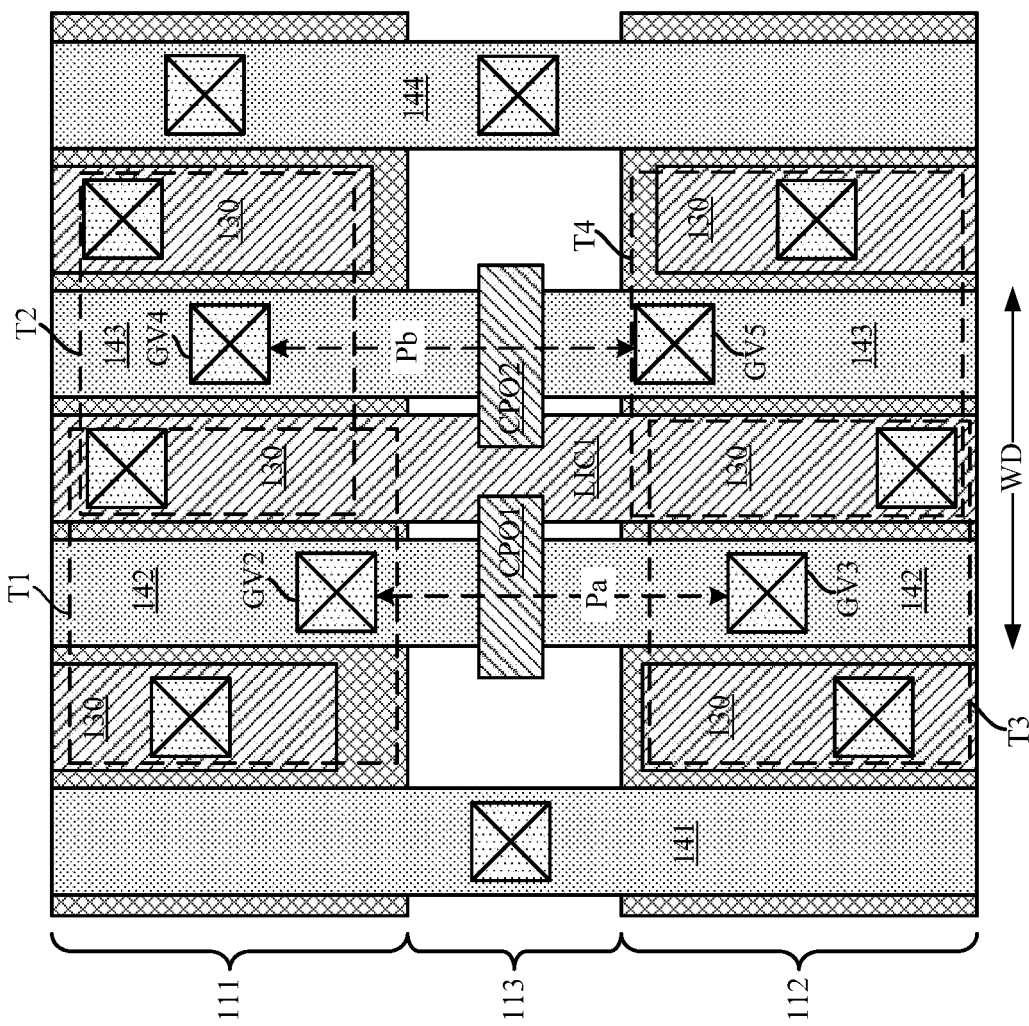
FIGS. 4A-4E are each a top view of a schematic layout of a semiconductor structure corresponding to a portion of the semiconductor structure in FIG. 1A, in accordance with various embodiments of the present disclosure.

As shown in FIG. 4A, the gate vias GV2 and GV4 are arranged above the first active region 111, and the gate vias GV3 and GV5 are arranged above the second active region 112. The gate vias GV2 and GV3 are coupled with the gate structure 142. The gate vias GV4 and GV5 are coupled with the gate structure 143. The local interconnect LIC1 is disposed in a region which is defined by, for illustration in FIG. 4A, the first active region 111, the second active region 112, and the gate structures 142 and 143.

For illustration in FIG. 4A, the gate vias GV2-GV5 are not aligned to each other. The gate via GV2 and the gate via GV3 have a pitch Pa therebetween. The gate via GV4 and the gate via GV5 have a pitch Pb therebetween. In some embodiments, the pitch Pa is equal to the pitch Pb. In various embodiments, the pitch Pa is in a range between about 0.7*Pb and about 1.3*Pb, which, in some embodiments, indicates that the pitch Pa is substantially equal to the pitch Pb.

Regarding the first guideline, there are three conditions to be followed in the first guideline. When three conditions are satisfied, the local interconnect LIC1 is allowed to be formed. The first condition of the first guideline is that there is at least one gate via disposed outside the non-active region 113. For illustration of FIG. 4A, the gate vias GV2-GV5 are disposed outside the non-active region 113. The second condition of the first guideline is that there is no gate via above the non-active region 113 around where the local interconnect LIC1 to be formed. For illustration of FIG. 4A, there is no gate via on the gate structure 142/143 above the non-active region 113. The third condition of the first guideline is that the pitches between gate vias on opposite sides of the local interconnect LIC1 are substantially the same. For illustration of FIG. 4A, the pitch Pa between the gate via GV2 and the gate via GV3 is substantially the same to the pitch Pb between the gate via GV4 and the gate via GV5.

Aforementioned distributions and configurations of the gate vias GV2-GV5, and the relationship between the pitches Pa and Pb, are regarded as the first guideline in some embodiments. When the first guideline is followed, the local interconnect LIC1 labeled in FIG. 4A is determined to be arranged in the region as discussed above, to connect the corresponding source/drain contacts 130 above the first active region 111 and the second active region 112.

In some embodiments, a separation spacer CPO1 is arranged to isolate electronic signals transmitted through different gate vias. For illustration in FIG. 4A, the separation spacer CPO1 is disposed on the gate structure 142, and is disposed between the gate vias GV2 and GV3. With the separation spacer CPO1, the electronic signal transmitted through the gate via GV2 is isolated from the electronic signal transmitted through the gate via GV3.

In some embodiments, a separation spacer CPO2 is also arranged to isolate electronic signals transmitted through different gate vias. For illustration, the separation spacer CPO2 is disposed on the gate structure 143, and is disposed between the gate vias GV4 and GV5. With the separation spacer CPO2, the electronic signal transmitted through the gate via GV4 is isolated from the electronic signal transmitted through the gate via GV5. In some embodiments, at least one of the separation spacers CPO1 and CPO2 is formed of a dielectric material. In some embodiments, the separation spacers CPO1 and CPO2 are poly cut layers, which are intermediate products during a semiconductor manufacturing procedure, and not existed in final products of the semiconductor circuit. A distance between the gate via GV4 and the separation spacer CPO2 is different from a distance between the gate via GV5 and the separation spacer CPO2.

As illustrated in FIG. 4A, a cross-coupling structure CPS, corresponding to the cross-coupling structure CPS in FIG. 3, is formed. In some embodiments, the cross-coupling structure CPS including the transistors T1-T4 in FIG. 3 is implemented by the embodiments of FIG. 4A. In various embodiments, the cross-coupling structure CPS including the transistors T1-T4 in FIG. 3 is also implemented by the embodiments illustrated below with reference to FIGS. 4B-4E.

Configurations of the transistors T1-T4 are discussed below for illustration of FIG. 4A. The transistor T1 includes two source/drain contacts 130, the gate structure 142 and the gate via GV2, above the first active region 111. The transistor T2 includes two source/drain contacts 130, the gate structure 143 and the gate via GV4, above the first active region 111. The transistor T3 includes two source/drain contacts 130, the gate structure 142 and the gate via GV3, above the second active region 112. The transistor T4 includes two source/drain contacts 130, the gate structure 143 and the gate via GV5, above the second active region 112. As illustrated in FIG. 4A, the transistors T1 and T2 share one source/drain contact 130, which corresponds to the node ND1 in FIG. 3, and the transistors T3 and T4 share one source/drain contact 130, which corresponds to the node ND2 in FIG. 3. The contacts 130 of the transistors T1-T4, in some embodiments, have locations that are staggered along a direction in which the first active region 111 extends.

For connecting the nodes ND1 and ND2 as illustrated in FIG. 3, the local interconnect LIC1 in FIG. 4A is arranged as discussed above. For isolating gates of the transistors T1 and T3 and gates of the transistors T2 and T4, the separation spacers CPO1 and CPO2 in FIG. 4A are arranged as discussed above. In some embodiments, the separation spacer CPO1, the separation spacer CPO2 and the local interconnect LIC1 in FIG. 4A are arranged within a width WD indicating three contacted poly pitches (3-CPP) to construct the cross-coupling structure CPS.

Figure 4B:
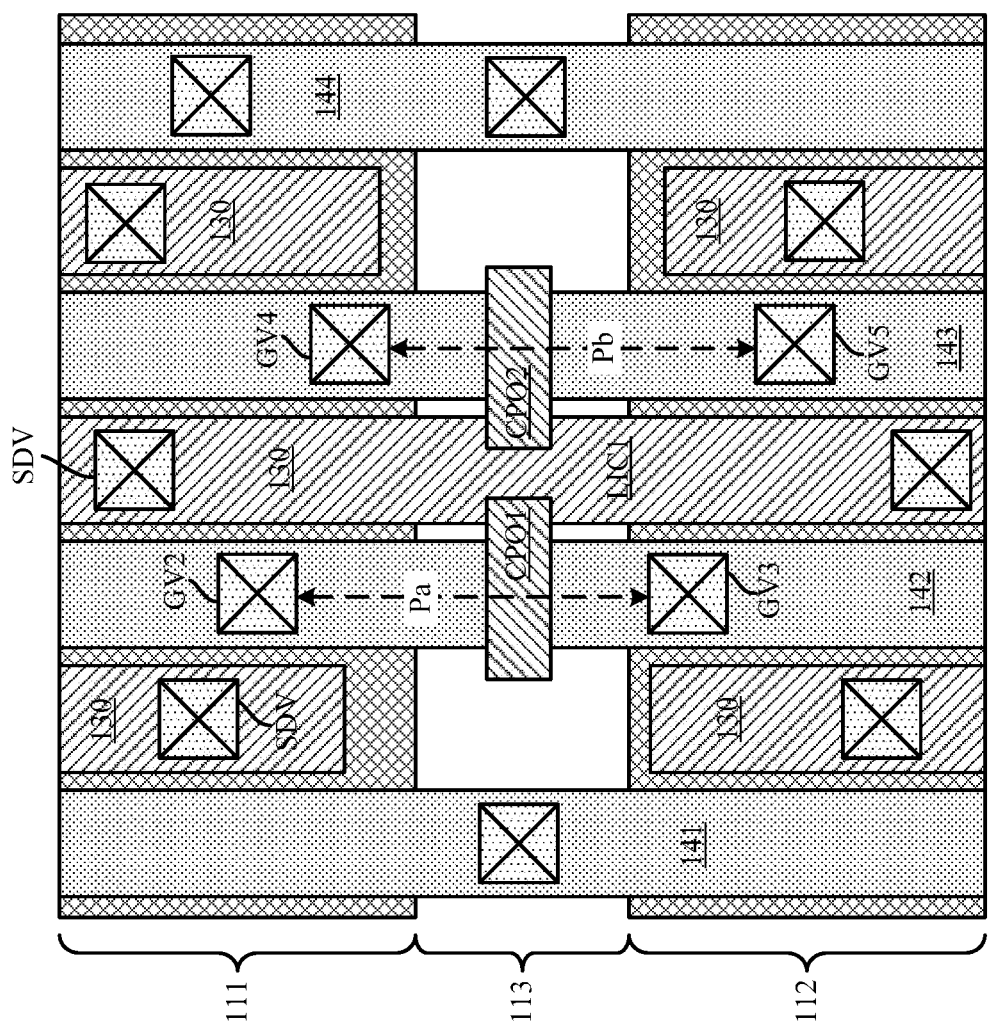

As shown in FIG. 4B, the configurations of the gate vias GV2-GV5, and the relationship between the pitches Pa and Pb, are similar to those illustrated in FIG. 4A. Based on the discussion above, the first guideline is also followed.

Compared to the embodiments in FIG. 4A, the locations of the gate vias GV2-GV5 in FIG. 4B are different from the locations of the gate vias GV2-GV5 in FIG. 4A. For illustration, the locations of the gate vias GV2 and GV3 are shifted toward the top of FIG. 4B, and the locations of the gate vias GV4 and GV5 are shifted toward the bottom of FIG. 4B, compared to those illustrated in FIG. 4A.

In FIG. 4B, the pitch Pa between the gate vias GV2 and GV3 is still equal to the pitch Pb between the gate vias GV4 and GV5 in some embodiments, or is still substantially equal to the pitch Pb in some other embodiments as discussed above.

By following the first guideline, the local interconnect LIC1 is also able to be arranged in the corresponding region which is defined by, for illustration in FIG. 4B, the first active region 111, the second active region 112, and the gate structures 142 and 143, to connect the corresponding source/drain contacts 130 in the first active region 111 and the second active region 112.

Figure 4C:
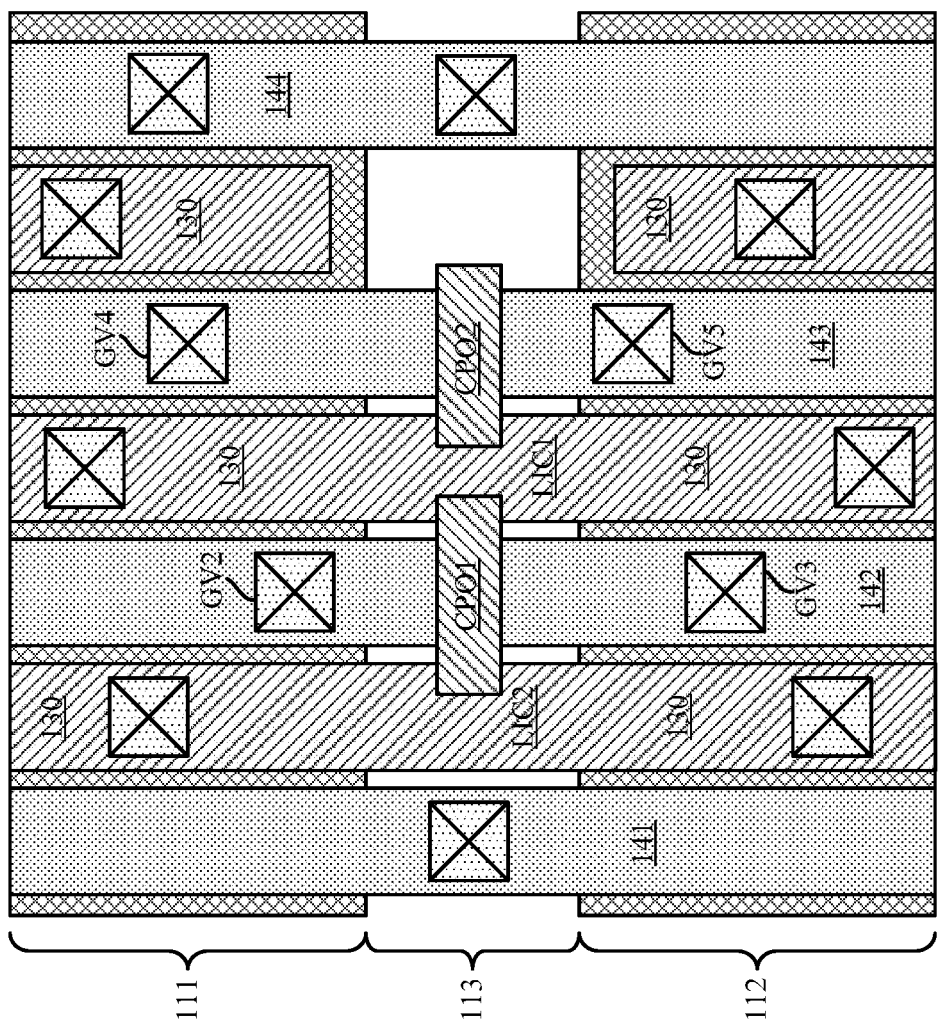

As shown in FIG. 4C, the distributions and configurations of the gate vias GV2-GV5, and the relationship between the pitches Pa and Pb, are similar to those illustrated in FIG. 4A. Based on the discussion above, the first guideline is also followed.

Compared to the embodiments in FIG. 4A, an additional local interconnect LIC2 in FIG. 4C is arranged. For illustration, the local interconnect LIC2 is disposed in a region which is defined by, for illustration, the first active region 111, the second active region 112, and the gate structures 141 and 142. The local interconnect LIC2 is arranged to connect the corresponding source/drain contacts 130 above the first active region 111 and the second active region 112.

Figure 4D:
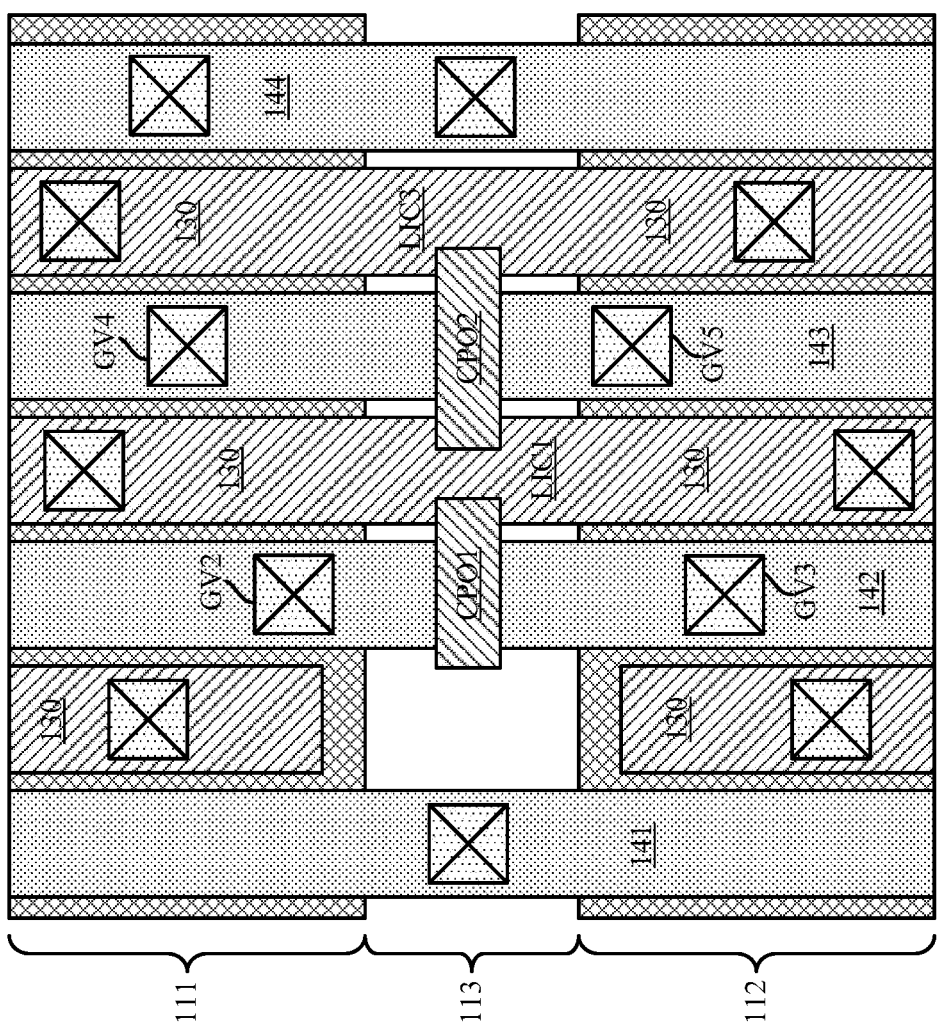

As shown in FIG. 4D, the distributions and configurations of the gate vias GV2-GV5, and the relationship between the pitches Pa and Pb, are similar to those illustrated in FIG. 4C. Based on the discussion above, the first guideline is also followed.

Compared to the embodiments in FIG. 4C, without the local interconnect LIC2, an additional local interconnect LIC3 in FIG. 4D is arranged. For illustration, the local interconnect LIC3 is disposed in a region which is defined by, the first active region 111, the second active region 112, and the gate structures 143 and 144. The local interconnect LIC3 is arranged to connect the corresponding source/drain contacts 130 above the first active region 111 and the second active region 112.

Figure 4E:
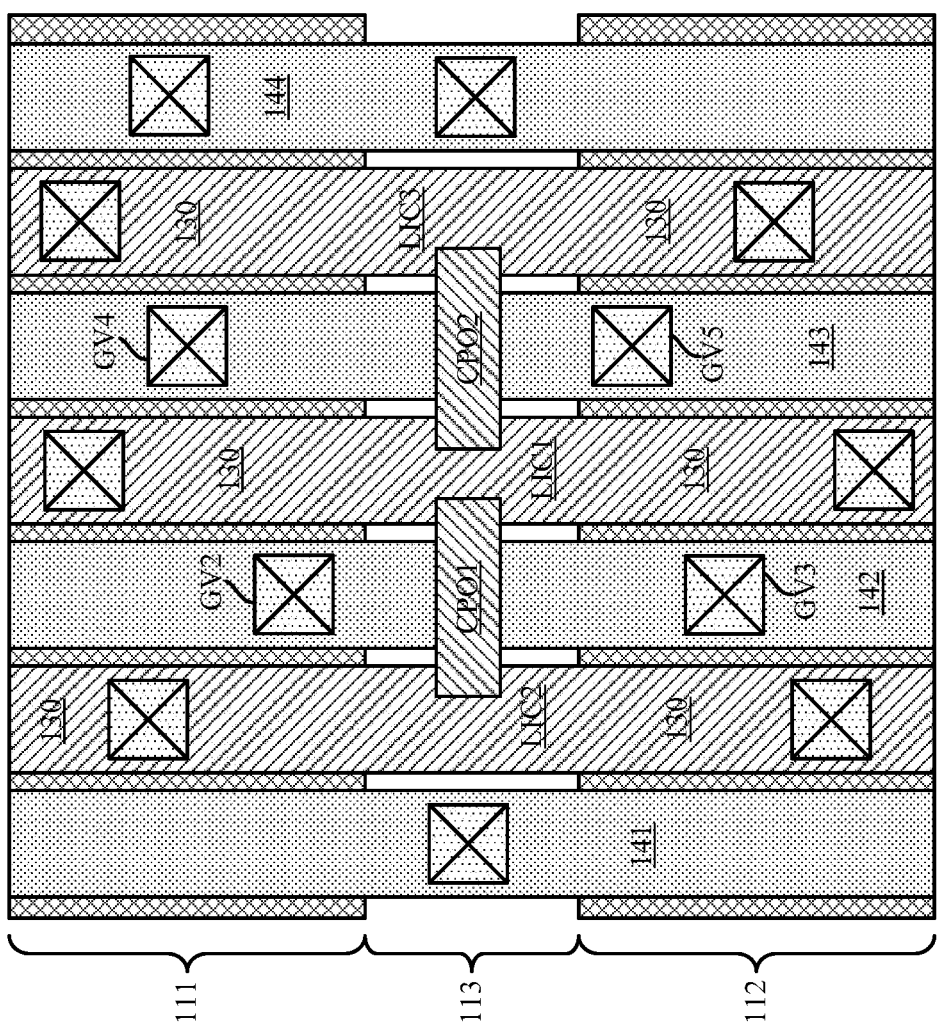

As shown in FIG. 4E, the distributions and configurations of the gate vias GV2-GV5, and the relationship between the pitches Pa and Pb, are similar to those illustrated in FIG. 4D. Based on the discussion above, the first guideline is also followed.

Compared to the embodiments in FIG. 4C and FIG. 4D, the embodiments in FIG. 4E includes the local interconnect LIC2 as illustrated in FIG. 4C, and also includes the local interconnect LIC3 as illustrated in FIG. 4D.

Based on the discussion above, the embodiments of FIGS. 4A-4E demonstrate the first guideline, which is related to arranging the layout corresponding to the cross-coupling structure CPS in FIG. 3.

Figure 5:
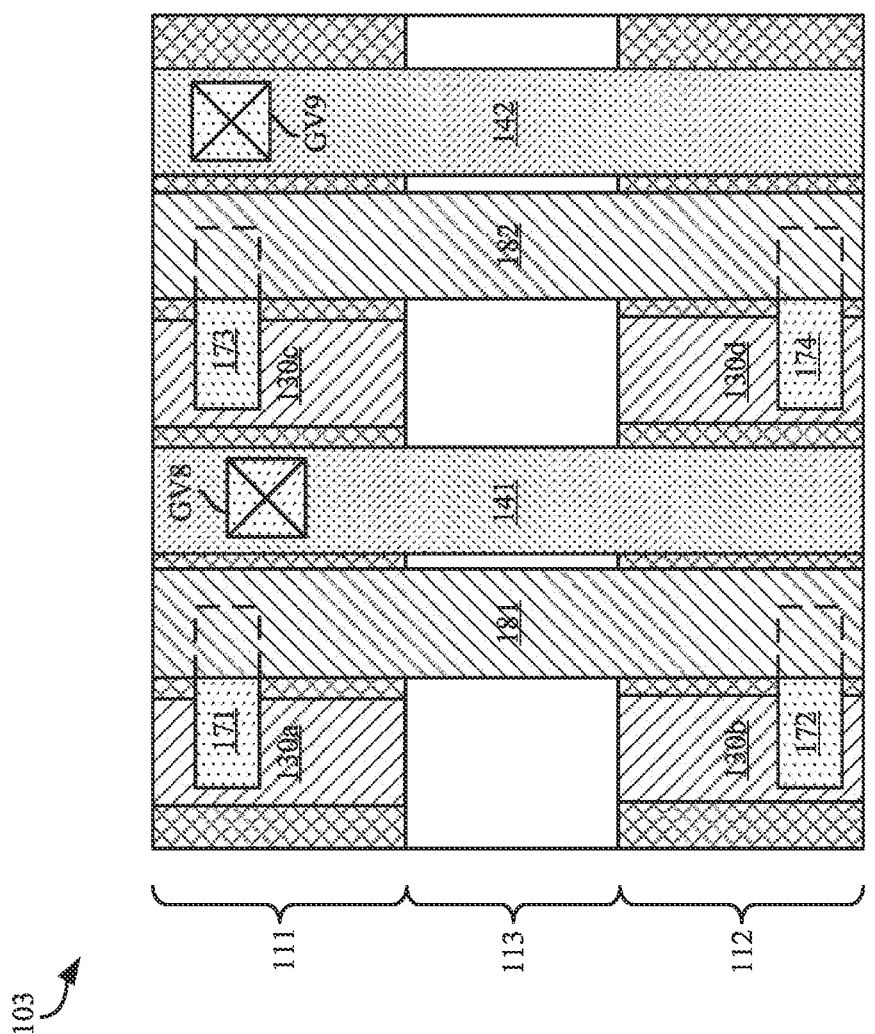
FIG. 5 is a top view of a schematic layout of a semiconductor structure in accordance with some other embodiments of the present disclosure.

FIG. 5 is a top view of a schematic layout of a semiconductor structure 103 in accordance with some other embodiments of the present disclosure. With respect to the embodiments of FIG. 1A, like elements in FIG. 5 are designated with the same reference numbers for ease of understanding.

For illustration in FIG. 5, source/drain contacts 130a and 130c are arranged above the first active region 111, and source/drain contacts 130b and 130d are arranged above the second active region 112. The gate structures 141 and 142 are both arranged above the first active region 111, the second active region 112 and the non-active region 113. Gate vias GV8 and GV9 are disposed above the first active region 111.

In FIG. 5, the source/drain contacts 130a and 130c above the first active region 111 are spaced apart from the source/drain contacts 130b and 130d above the second active region 112, by the non-active region 113. In some embodiments, the source/drain contact 130a is coupled through a connector 171 to a high-level interconnect 181, and the source/drain contact 130b is coupled through a connector 172 to the high-level interconnect 181. Accordingly, the source/drain contacts 130a and 130b are coupled with each other through the connector 171, the high-level interconnect 181 and the connector 172. In some embodiments, the high-level interconnect 181 is formed in a metal one (M1) layer. In some embodiments, the connectors 171 and 172 are each a contact, and formed in a layer different from the metal one (M1) layer. In some embodiments, each of the connectors 171 and 172 is a via which is disposed between source/drain contacts 130a and 130b, respectively, and the high-level interconnect 181, which is a metal one (M1) layer.

As illustrated in FIG. 5, in some other embodiments, the source/drain contact 130c is coupled through a connector 173 to a high-level interconnect 182, and the source/drain contact 130d is coupled through a connector 174 to the high-level interconnect 182. Accordingly, the source/drain contacts 130c and 130d are coupled with each other through the connector 173, the high-level interconnect 182 and the connector 174. In some embodiments, the high-level interconnect 182 is formed in the metal one (M1) layer. In some embodiments, the connectors 173 and 174 are each a contact, and formed in a layer different from the metal one (M1) layer.

Figure 6:
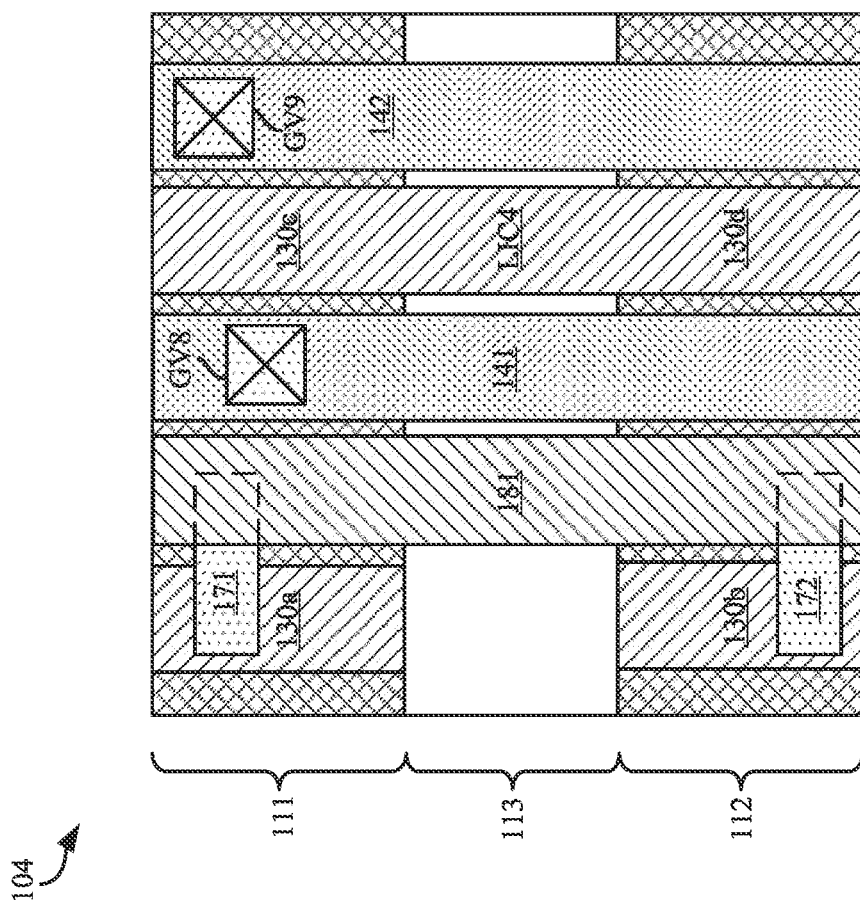
FIG. 6 is a top view of a portion of a schematic layout of a semiconductor structure in accordance with alternative embodiments of the present disclosure.

FIG. 6 is a top view of a portion of a schematic layout of a semiconductor structure 104 in accordance with alternative embodiments of the present disclosure. With respect to the embodiments of FIG. 5, like elements in FIG. 6 are designated with the same reference numbers for ease of understanding. In some embodiments, a second guideline is provided to determine whether to arrange a local interconnect LIC4 as labeled in FIG. 6. FIG. 6 illustrates some embodiments in which the local interconnect LIC4 is arranged when the second guideline is followed. Compared to the embodiments of FIG. 5, the embodiments in FIG. 6 are constructed to have the local interconnect LIC4, without the connectors 173 and 174.

In some embodiments, the gate via GV9 and the gate structure 142 in FIG. 6 are configured to receive a fixed voltage including, for example, a high system voltage VDD, a low system voltage VSS, a ground voltage GND, or the like.

Aforementioned distribution of the gate via GV9, and the configuration of the gate via GV9 to receive the fixed voltage, follow the second guideline to implement, for illustration, the local interconnect LIC4, to connect the source/drain contacts 130c and 130d. By following the second guideline, the local interconnect LIC4 is determined to be arranged in a region which is defined by, for illustration in FIG. 6, the first active region 111, the second active region 112, and the gate structures 141 and 142.

The distributions and configurations of the layouts illustrated in FIG. 6 are given for illustrative purposes. Various distributions and configurations of the layouts in FIG. 6 are within the contemplated scope of the present disclosure. For example, in various embodiments, the embodiments in FIG. 6 are further constructed without the gate via GV9. In such embodiments, the gate structure 142 is configured to be floated, as a floating gate. The distribution of the gate via GV8, and the configuration of the gate structure 142 as a floating gate, also follow the second guideline to implement the local interconnect LIC4 in the region as discussed above. With the local interconnect LIC4, fewer connectors are required for the semiconductor structure 104 in FIG. 6, compared to the semiconductor structure 103 using the layout in FIG. 5. In some embodiments, the "floated" is also referred to as having a floating voltage, or being not connected electrically to another non-floated conductor.

In some embodiments, a third guideline is further provided to determine whether to arrange the local interconnect LIC4 in FIG. 6. In some embodiments, for the third guideline, if at least one of the source/drain contacts 130a-130d in FIG. 6 is an output drain of a standard cell, the local interconnect LIC4 is banned and/or not arranged. In some embodiments, the standard cell includes, for example, an inverter cell, a NAND gate logic cell, a NOR gate logic cell, or any equivalent cell.

In some approaches, when a local interconnect is formed around an output drain of a standard cell, the parasitic capacitance of the output drain increases. With the increased parasitic capacitance, a speed of accessing the output drain is reduced. Moreover, when there is an output drain, an access pin coupled to the output drain is required in related approaches, thus increasing the size of the entire semiconductor structure with the local interconnect. Based on the discussion above, under the third guideline, the local interconnect LIC4 is banned and/or not arranged if at least one of the source/drain contacts 130a-130d in FIG. 6 is an output drain of a standard cell.

Figure 7:
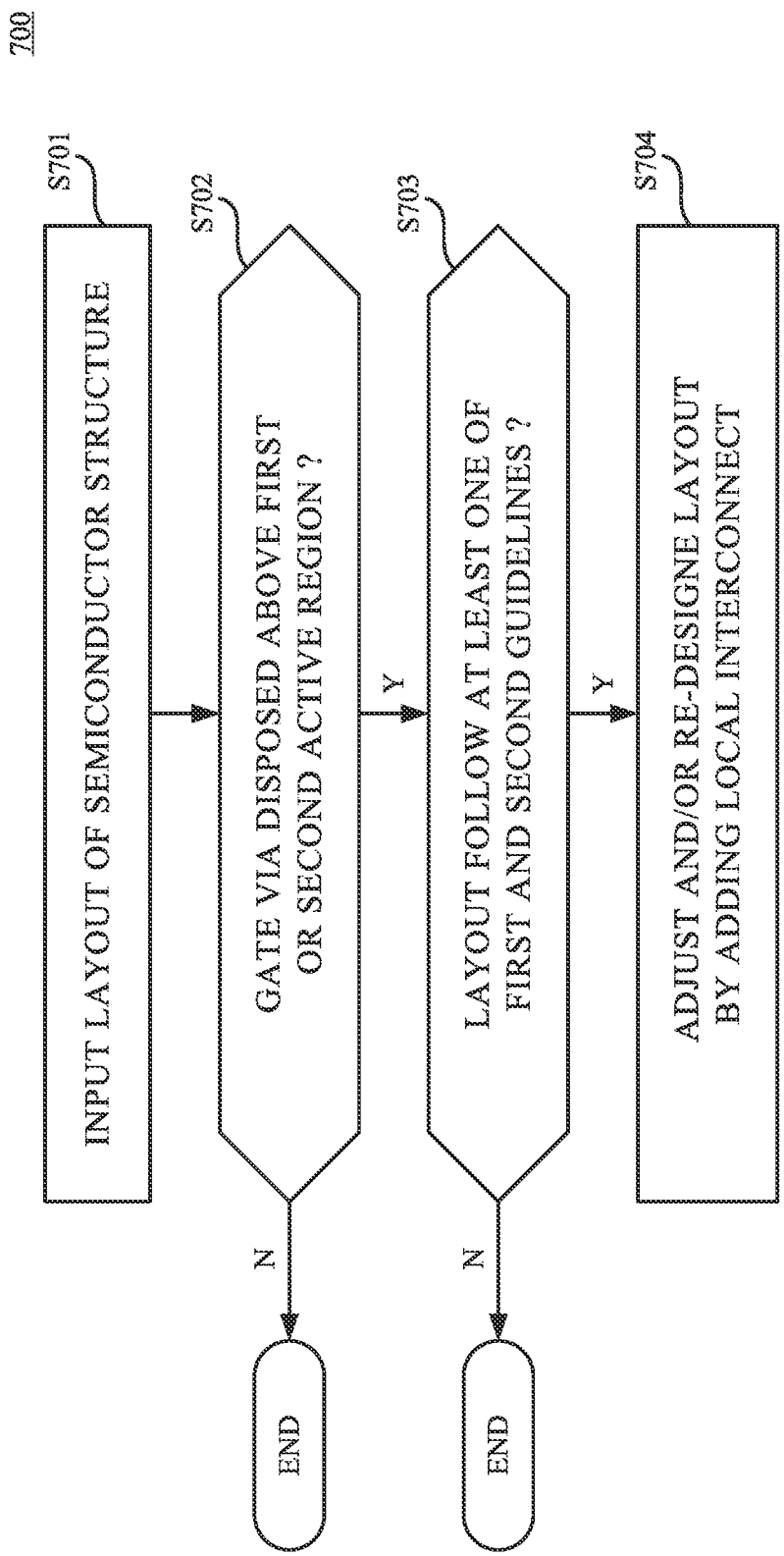
FIG. 7 is a flow chart illustrating a method for design of layouts of semiconductor structures, according to some embodiments of the present disclosure.

FIG. 7 is a flow chart illustrating a method 700 for design of layouts of semiconductor structures, according to some embodiments of the present disclosure. For illustration, the method 700 is applied for design of the layouts of the semiconductor structures in FIG. 1A, FIG. 2A, and FIGS. 4A-6. In some embodiments, the method 700 is applied for verifying and/or adjusting layouts of semiconductor structures.

In some embodiments, the method 700 is performed, for example, using a computer (not shown), which runs the software for designing integrated circuits. The software includes a circuit layout tool, which has a function of placement and routing. In some embodiments, the computer includes a tangible storage medium (not shown), including, for example, a hard drive, for storing a standard cell represented by at least a portion of the semiconductor structures as discussed above. In some embodiments, the computer includes a processing unit (not shown) for retrieving the standard cell from the tangible storage medium, and for performing layout and/or placement associated with the standard cell in a placement operation.

For illustration in FIG. 7, the method 700 is performed to determine if the local interconnect LIC as discussed above is to be arranged in the semiconductor structure. Accordingly, the method 700 is discussed below on the basis of no local interconnect LIC in the semiconductor structure. The method 700 is given for illustrative purposes. Various operations of the method 700 performed, for example, when the local interconnect LIC has been arranged in the semiconductor structure, are within the contemplated scope of the present disclosure.

In operation S701, a layout of a semiconductor structure is inputted, for illustration, into the computer as discussed above. For illustration in FIG. 1A, the layout of the semiconductor structure 101 is inputted to be verified, in order to determine if the local interconnect LIC is to be arranged in the semiconductor structure 101.

In operation S702, whether or not there is at least one gate via disposed above the first active region or the second active region is determined. For illustration in FIG. 1A, whether or not there is at least one of the gate vias GV0-GV7 disposed above the first active region 111 or the second active region 112 is determined. If not, the operation of the method 700 is terminated, because, without gate via, the guideline associated with distributions and configurations of gate vias does not have to be determined or followed. On the other hand, if so, operation S703 is then performed.

In operation S703, whether or not the layout of the semiconductor structure follows at least one of the first guideline and the second guideline as discussed above is determined. If so, the operation of the method 700 is terminated, because, when the layout follows at least one of the first guideline and the second guideline, operation S704 is then performed. On the other hand, if not, the adjustment and/or re-design of the layout do not have to be performed.

In operation S704, the layout is adjusted and/or re-designed by adding at least one local interconnect as discussed above, over, for illustration, the non-active region 113 in FIG. 1A. With the local interconnect, the source/drain contacts on different active regions are connected across the non-active region, without implementing high-level connectors. The size of the semiconductor structure is able to be reduced, because it is not necessary to implement high-level connectors to interconnect the source/drain contacts on different active regions.

For illustration in FIG. 1A, if the layout of the semiconductor structure 101 follows the first guideline, the layout of the semiconductor structure 101 is adjusted and/or re-designed by adding the local interconnect LIC. For another illustration in FIG. 6, if the layout of the semiconductor structure 104 follows the second guideline, the layout of the semiconductor structure 104 is adjusted and/or re-designed by adding the local interconnect LIC4.

In some embodiments, in operation S703, whether or not the layout of the semiconductor structure follows both of the second guideline and the third guideline as discussed above is further determined. If so, the operation of the method 700 is terminated, because, as discussed above, when the layout follows the second guideline and the third guideline, the local interconnect is banned and/or not to be arranged. Accordingly, operation S704 does not have to be performed.

In some embodiments, a method is disclosed, including the following operations: arranging a first gate structure extending continuously above a first active region and a second active region of a substrate; arranging a first separation spacer disposed on the first gate structure to isolate an electronic signal transmitted through a first gate via and a second gate via that are disposed on the first gate structure, wherein the first gate via and the second gate via are arranged above the first active region and the second active region respectively; and arranging a first local interconnect between the first active region and the second active region, wherein the first local interconnect is electrically coupled to a first contact disposed on the first active region and a second contact disposed on the second active region.

Also disclosed is a method is disclosed, including the following operations: arranging a plurality of gate structures above a first active region, a second active region and a non-active region of a substrate of a semiconductor structure, wherein the first and second active regions are spaced apart by the non-active region; arranging a plurality of contacts above the first and second active regions; arranging a first separation spacer between the plurality of contacts; arranging at least one first gate via above the first active region or the second active region, wherein the at least one first gate via is electrically coupled with at least one of the plurality of gate structures; and selectively arranging at least one local interconnect over the non-active region, to couple a first contact of the plurality of contacts above the first active region to a second contact of the plurality of contacts above the second active region.

Also disclosed is a method is disclosed, including the following operations: arranging a first gate structure extending continuously above a first active region and a second active region of a substrate; arranging a first separation spacer disposed on the first gate structure to isolate an electronic signal transmitted through a first gate via and a second gate via that are disposed on the first gate structure; and arranging a first local interconnect between the first active region and the second active region, wherein the first local interconnect is electrically coupled to a first contact disposed above the first active region and a second contact disposed above the second active region, wherein the first separation spacer overlaps the first local interconnect and has a width larger than a width of the first gate structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a first gate structure, a second gate structure, and at least one local interconnect that extend continuously across a non-active region from a first active region to a second active region;
   a first separation spacer disposed on the first gate structure; and
   a plurality of first vias on the first gate structure, wherein the plurality of first vias, that are arranged on opposite sides of the first separation spacer, are isolated from each other and apart from the first separation spacer by different distances.

2. The semiconductor structure of claim 1, further comprising:
   a second separation spacer disposed on the second gate structure to isolate an electronic signal transmitted through a plurality of second vias that are disposed on the second gate structure.

3. The semiconductor structure of claim 2, wherein the plurality of first vias and the plurality of second vias are disposed outside the non-active region.

4. The semiconductor structure of claim 1, further comprising:
   a first contact arranged above the first active region; and
   a second contact arranged above the second active region,
   wherein the at least one local interconnect is configured to couple the first contact to the second contact.

5. The semiconductor structure of claim 4, wherein the at least one local interconnect, the first contact, and the second contact are disposed between the first gate structure and the second gate structure.

6. The semiconductor structure of claim 1, further comprising:
   a first contact and a second contact that are coupled to each other through the at least one local interconnect,
   wherein the first contact and the second contact are disposed outside the non-active region.

7. The semiconductor structure of claim 1, wherein the first separation spacer overlaps the first gate structure and the at least one local interconnect.

8. The semiconductor structure of claim 1, further comprising:
   a plurality of second vias that are disposed on the second gate structure,
   wherein the at least one local interconnect is adjacent to the first gate structure or the second gate structure,
   wherein a first pitch between the plurality of first vias is substantially equal to a second pitch between the plurality of second vias.

9. The semiconductor structure of claim 1, wherein the first separation spacer crosses the at least one local interconnect.

10. The semiconductor structure of claim 1, wherein the first separation spacer overlaps the non-active region, without overlapping the first active region and the second active region.

11. A semiconductor structure, comprising:
    a plurality of gate structures and a plurality of local interconnects that are interlaced along a first direction and overlap a non-active region;
    a plurality of first vias arranged on the plurality of gate structures and separated from each other in a second direction by a first distance;
    a plurality of second vias arranged on the plurality of local interconnects and separated from each other in the second direction by a second distance greater than the first distance; and
    a plurality of separation spacers that are configured to electrically isolate the plurality of first vias from each other and overlap the non-active region, the plurality of gate structures, and the plurality of local interconnects.

12. The semiconductor structure of claim 11, wherein the plurality of separation spacers align with each other along the first direction.

13. The semiconductor structure of claim 12, wherein the plurality of separation spacers extend in the first direction.

14. The semiconductor structure of claim 11, wherein the plurality of gate structures and the plurality of local interconnects extend in the second direction and overlap a first active area and a second active area,
    wherein the first active area and the second active area are separated by the non-active region.

15. The semiconductor structure of claim 11, wherein the plurality of first vias and the plurality of second vias are disposed outside of the non-active region.

16. The semiconductor structure of claim 11, wherein a length of the plurality of separation spacers is greater than that of the plurality of first vias and the plurality of second vias along the first direction.

17. A semiconductor structure, comprising:
    a first gate structure and a first separation spacer extending across the first gate structure, wherein widths of the first gate structure and the first separation spacer are different;
    a plurality of first vias arranged on opposite sides of the first separation spacer;
    a first local interconnect disposed over a first region and coupled to the plurality of first vias, wherein the first region is part of a non-doped region; and
    a plurality of second vias that are arranged on opposite sides of the first separation spacer and on the first gate structure, wherein a portion, above the first region, of the first gate structure has no vias thereon.

18. The semiconductor structure of claim 17, further comprising:
    a second gate structure and a second separation spacer extending across the second gate structure, wherein a width of the second gate structure is smaller than the second separation spacer,
    wherein the first local interconnect is interposed between the first gate structure and the second gate structure.

19. The semiconductor structure of claim 17, further comprising:
    a second local interconnect that is overlapped by the first separation spacer and configured to couple a plurality of third vias, arranged on opposite sides of the first separation spacer, with each other.

20. The semiconductor structure of claim 19, further comprising:
    a second separation spacer that is interposed between the plurality of third vias; and
    a third local interconnect that is overlapped by the second separation spacer and configured to couple a plurality of fourth vias, arranged on opposite sides of the second separation spacer, with each other.

* * * * *